(12) United States Patent
Kim

(10) Patent No.: US 7,450,466 B2
(45) Date of Patent: Nov. 11, 2008

(54) DATA INPUT DEVICE OF SEMICONDUCTOR MEMORY DEVICE

(75) Inventor: Yong-Mi Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 188 days.

(21) Appl. No.: 11/477,537

(22) Filed: Jun. 30, 2006

(65) Prior Publication Data

US 2007/0071076 A1 Mar. 29, 2007

(30) Foreign Application Priority Data

Sep. 29, 2005 (KR) .................. 10-2005-0091575
Mar. 22, 2006 (KR) .................. 10-2006-0026261

(51) Int. Cl.
*G11C 8/18* (2006.01)

(52) U.S. Cl. .................. 365/233.5; 365/193; 365/191

(58) Field of Classification Search .............. 365/233.5, 365/193, 191, 194, 233, 189.05
See application file for complete search history.

(56) References Cited

U.S. PATENT DOCUMENTS

| 5,289,584 | A   | 2/1994  | Thome et al.            |
|-----------|-----|---------|-------------------------|
| 5,917,772 | A   | 6/1999  | Pawlowski               |
| 6,262,940 | B1  | 7/2001  | Choi et al.             |
| 6,707,723 | B2* | 3/2004  | Jeong .......... 365/189.05 |
| 6,956,789 | B2  | 10/2005 | Agrawal et al.          |
| 6,965,262 | B2  | 11/2005 | Zerbe                   |
| 6,987,704 | B2* | 1/2006  | Park ............. 365/233 |
| 6,987,705 | B2* | 1/2006  | Kim et al. ........... 365/154 |
| 7,020,031 | B2  | 3/2006  | Shin et al.             |
| 2002/0093871 | A1* | 7/2002 | Kwak .......... 365/233 |
| 2004/0240302 | A1  | 12/2004 | Park                   |

FOREIGN PATENT DOCUMENTS

| KR | 1999-023238    | 3/1999 |
| KR | 1020000045353 A | 7/2000 |
| TW | 200414222      | 8/2004 |
| TW | 200506965      | 2/2005 |
| TW | 1239014        | 9/2005 |

OTHER PUBLICATIONS

Korean Office Action issued in corresponding Korean Patent Application No. 10-2006-0026261 dated on Oct. 29, 2007.
Taiwanese Office Action issued in Taiwanese Patent Application No. 095123934 dated May 15, 2008.

* cited by examiner

*Primary Examiner*—Dang T Nguyen
(74) *Attorney, Agent, or Firm*—McDermott Will & Emery LLP

(57) ABSTRACT

A data input device of a semiconductor memory device can reduce unnecessary current consumption occurring according to a setting of a bandwidth. The data input device includes: a bandwidth signal input part for receiving a bandwidth signal for setting a data bandwidth to output an internal bandwidth signal; a synchronization control part for generating synchronization signals and restrict-synchronization signals in synchronization with a data strobe signal, an activation of the restrict-synchronization signals being restricted through the internal bandwidth signal; a first data input part for aligning the data in response to the synchronization signals; and a second data input part for aligning the data in response to the restrict-synchronization signal and the internal bandwidth signal.

19 Claims, 7 Drawing Sheets

DATA INPUT DEVICE OF SEMICONDUCTOR MEMORY DEVICE

FIELD OF THE INVENTION

The present invention relates to a semiconductor memory device; and, more particularly, to a data input device of a semiconductor memory device with low current consumption.

DESCRIPTION OF RELATED ART

Generally, data are input to a semiconductor memory device in synchronization with a data strobe signal indicating that effective data are applied. When the input data are multiple bits, data are applied in synchronization with edges of the data strobe signal so as to detect each bit.

A semiconductor memory device may be designed to support data bandwidth of X4, X8 or X16 by setting a bandwidth signal. Accordingly, data applied through specific data pins according to the set bandwidth are effective, while data applied through data pins other than the specific data pins are ineffective.

Therefore, a data input device of the semiconductor memory device aligns data that are selectively applied through data pins according to the set bandwidth.

FIG. 1 is a block diagram of a conventional data input device of a semiconductor memory device.

Referring to FIG. 1, the conventional data input device includes a synchronization control part 10, a bandwidth signal input part 20, first to fourth data input parts 30, 40, 50 and 60, and fifth to eighth data input parts 70, 80, 90 and 95. The synchronization control part 10 generates first and second synchronization signals DQSRP and DQSFP synchronized with rising and falling edges of a data strobe signal DQS_PAD. The bandwidth signal input part 20 receives a bandwidth signal IOX4_PAD to generate an internal bandwidth signal X4I. The first to fourth data input parts 30, 40, 50 and 60 receive data through data pins in response to the first and second synchronization signals DQSRP and DQSFP. The fifth to eighth data input parts 70, 80, 90 and 95 receive data through data pins in response to the first and second synchronization signals DQSRP and DQSFP.

The synchronization control part 10 includes a signal inputting unit 12 for receiving the data strobe signal DQS_PAD to output an internal data strobe signal DQSI, and a signal generating unit 14 for generating the first and second synchronization signals DQSRP and DQSFP synchronized with the rising and falling edges of the internal data strobe signal DQSI.

FIG. 2 is a circuit diagram of the signal generating unit 14 of FIG. 1.

Referring to FIG. 2, the signal generating unit 14 includes a first inverter I1 for inverting the internal data strobe signal DQSI, a transfer gate TG1 for transferring an output signal of the first inverter I1, a second inverter I2 for inverting the output signal of the first inverter I1, a first unit delay 14A for delaying an output signal of the second inverter I2, a third inverter I3 for inverting an output signal of the first unit delay 14A to output the first synchronization signal DQSRP, a second unit delay 14B for delaying an output signal of the transfer gate TG1, and a fourth inverter I4 for inverting an output signal of the second unit delay 14B to output the second synchronization signal DQSFP.

That is, the signal generating unit 14 generates the first and second synchronization signals DQSRP and DQSFP synchronized with the falling and rising edges every when the internal data strobe signal DQSI is applied.

FIG. 3 is a circuit diagram of the fifth data input part 70 of FIG. 1.

Referring to FIG. 3, the fifth data input part 70 includes a buffer 71 for receiving an internal data DIN in response to a write information signal WT and the internal bandwidth signal X4I, a delay unit 72 for delaying the first and second synchronization signals DQSRP and DQSFP, and a latch 73 for storing output signals of the buffer 71, which are input in sequence, in synchronization with edges of first and second delay-synchronization signals DQSRPD and DQSFPD and outputting 4-bit parallel data ARD1, ARD0, AFD1 and AFD0.

Specifically, the latch 73 includes a first latch 73A for storing positive and negative outputs In and INB of the buffer 71 in response to the first delay-synchronization signal DQSRPD, a second latch 73B for storing an output data of the first latch 73A in response to the second delay-synchronization signal DQSFPD and outputting the first parallel data ARD1, a third latch 73C for storing the positive and negative outputs IN and INB of the buffer 71 in response to the second delay-synchronization signal DQSFPD and outputting the second parallel data AFD1, a fourth latch 73D for storing the first parallel data ARD1 in response to the first delay-synchronization signal DQSRPD, a fifth latch 73E for storing the second parallel data AFD1 in response to the first delay-synchronization signal DQSRPD, a sixth latch 73F for storing an output data of the fourth latch 73D in response to the second delay-synchronization signal DQSFPD and outputting the third parallel data ARD0, and a seventh latch 73G for storing an output data of the fifth latch 73E in response to the second delay-synchronization signal DQSFPD and outputting the fourth parallel data AFD0.

FIG. 4 is a circuit diagram of the delay unit 72 of FIG. 3.

Referring to FIG. 4, the delay unit 72 includes a first inverter I5 for inverting the first synchronization signal DQSRP, a first unit delay 72A for delaying an output signal of the first inverter I5 for a predetermined time, a second inverter I6 for inverting an output signal of the first unit delay 72A to output the first delay-synchronization signal DQSRPD, a third inverter I7 for inverting the second synchronization signal DQSFP, a second unit delay 72B for delaying an output signal of the third inverter I7 for a predetermined time, and a fourth inverter I8 for inverting an output signal of the second unit delay 72B to output the second delay-synchronization signal DQSFPD.

An operation of the data input part illustrated in FIGS. 3 and 4 will be described below.

The buffer 71 receives the internal data DIN when the internal bandwidth signal X4I is deactivated and the write information signal WT is activated. The delay unit 72 delays the first and second synchronization signals DQSRP and DQSFP for a predetermined time to output the first and second delay-synchronization signals DQSRPD and DQSFPD.

The first latch 73A latches the positive and negative outputs IN and INB of the buffer 71 in response to the activation of the first delay-synchronization signal DQSRPD. Then, the second latch 73B latches the data stored in the first latch 73A in response to the second delay-synchronization signal DQSFPD activated after the first delay-synchronization signal DQSRPD. Also, the third latch 73C latches the positive and negative outputs IN and INB of the buffer 71 in response to the second delay-synchronization signal DQSFPD. Then, the fourth and fifth latches 73D and 73E latch the data stored in the second and third latches 73B and 73C in response to the first delay-synchronization signal DQSRPD activated after the second delay-synchronization signal DQSFPD, respectively. The first latch 73A stores the positive and negative outputs IN and INB of the buffer 71. Also, when the second delay-synchronization signal DQSFPD is activated, the second and third latches 73B and 73C latch the data stored in the first latch 73A and the data applied through the positive and negative outputs IN and INB of the buffer 71, respectively. The sixth and seventh latches 73F and 73G latch the data stored in the fourth and fifth latches 73D and 73E.

Therefore, when the internal bandwidth signal X4I is deactivated and the write information signal WT is activated, the fifth data input part 70 stores the internal data DIN through a plurality of latches, which are arranged in two rows, in response to the first and second synchronization signals DQSRP and DQSFP activated in sequence. In this manner, the data stored in the second to seventh latches 73B to 73G are output as the first to fourth parallel data ARD1, AFD1, ARD0 and AFD0.

When the internal bandwidth signal X4I is activated, the buffer 71 of the fifth data input part 70 is not driven, so that the internal data is not applied.

The fifth to eighth data input parts have the same circuit configuration and driving scheme as those of the data input part of FIGS. 3 and 4. The first to fourth data input parts do not receive the internal bandwidth signal X4I.

Therefore, when the bandwidth is set to X8, the first to eighth data input parts align the data applied through the corresponding data pins in response to the first and second synchronization signals and output the aligned data.

Also, when the bandwidth is set to X4, the internal bandwidth signal is activated by the bandwidth signal generating unit, so that the fifth to eighth data input parts do not receive the data applied through the corresponding data pins. The first to fourth data input parts align the applied data regardless of the bandwidth.

The reason for controlling the driving of the data input part according to the setting of the bandwidth is that when the bandwidth is set to X4, the data applied through the data pins DQ0 to DQ3 are effective, while the data applied through the data pins DQ4 to DQ7 are ineffective. By restricting the driving of the data input part receiving the ineffective data, unnecessary current consumption can be reduced.

In the fifth to eighth data input parts whose driving is restricted according to the bandwidth, the buffer is turned off by the internal bandwidth signal so that the internal data is not applied. However, the latch is driven because the first and second synchronization signals are still activated, causing current consumption.

As described above, the latch of the data input device is activated even when the effective data is not applied, causing unnecessary current consumption.

SUMMARY OF THE INVENTION

It is, therefore, an object of the present invention to provide a data input device of a semiconductor memory device for reducing unnecessary current consumption occurring according to the setting of the bandwidth.

In accordance with an aspect of the present invention, there is provided a data input device of a semiconductor memory device, including: a bandwidth signal input part for receiving a bandwidth signal for setting a data bandwidth to output an internal bandwidth signal; a synchronization control part for generating synchronization signals and restrict-synchronization signals in synchronization with a data strobe signal, an activation of the restrict-synchronization signals being restricted through the internal bandwidth signal; a first data input part for aligning the data in response to the synchronization signals; and a second data input part for aligning the data in response to the restrict-synchronization signal and the internal bandwidth signal.

In accordance with another aspect of the present invention, there is provided a data input device of a semiconductor memory device, including: a first synchronization control part for generating synchronization signals synchronized with edges of a data strobe signal; a second synchronization control part for generating restrict-synchronization signals synchronized with the edges of the data strobe signal in response to a bandwidth signal for setting a data bandwidth; a first data input part for aligning data in response to the synchronization signals; and a second data input part for aligning the data in response to the restrict-synchronization signal and an internal bandwidth signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A data input device of a semiconductor memory device in accordance with exemplary embodiments of the present invention will be described in detail with reference to the accompanying drawings.

Figure 1:
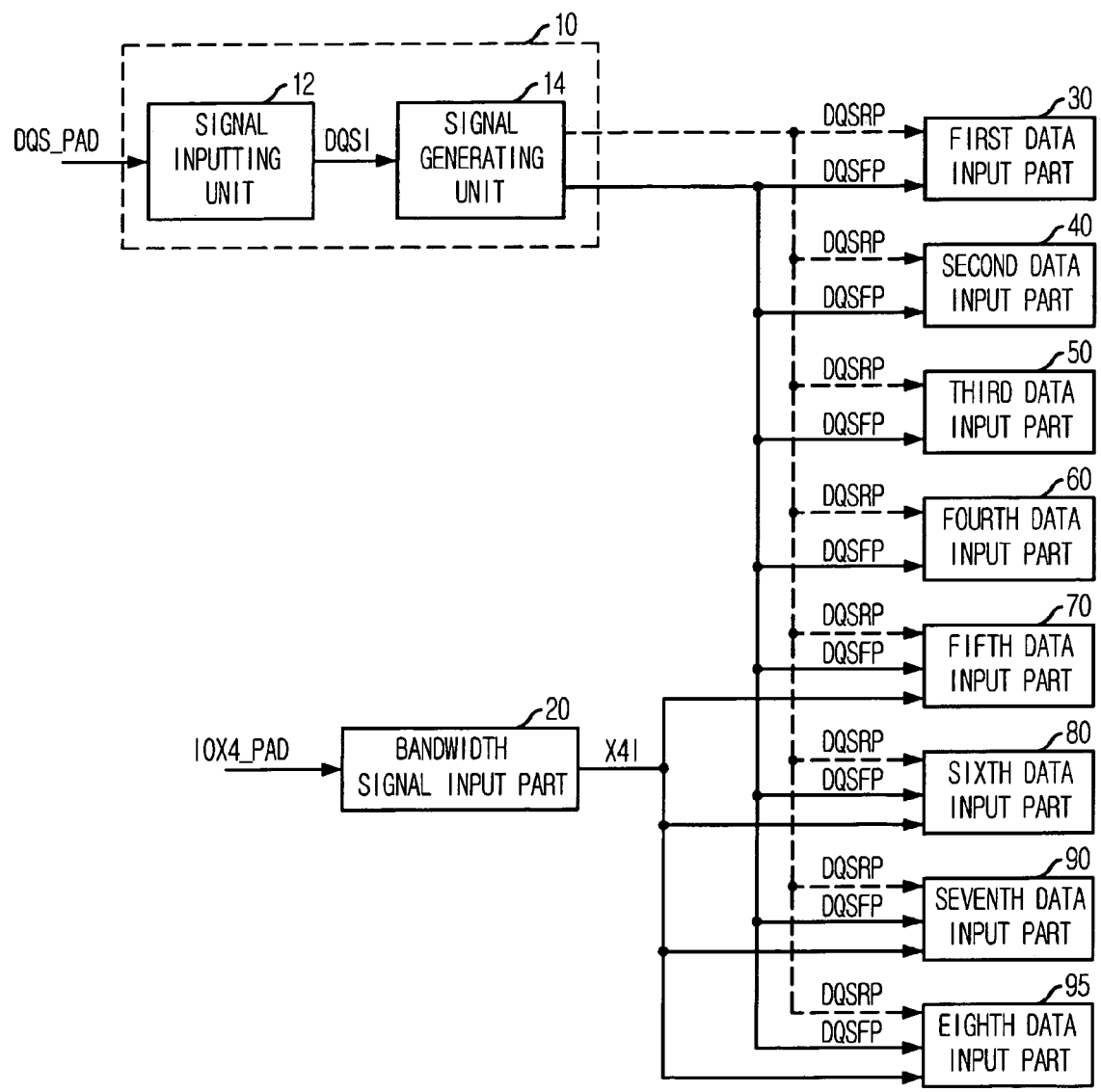
FIG. 1 is a block diagram of a conventional data input device of a semiconductor memory device.
Figure 2:
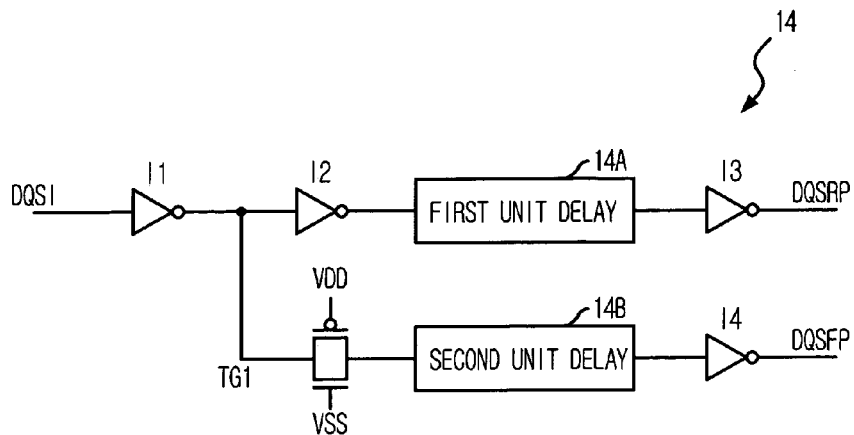
FIG. 2 is a circuit diagram of a signal generating unit of FIG. 1.
Figure 3:
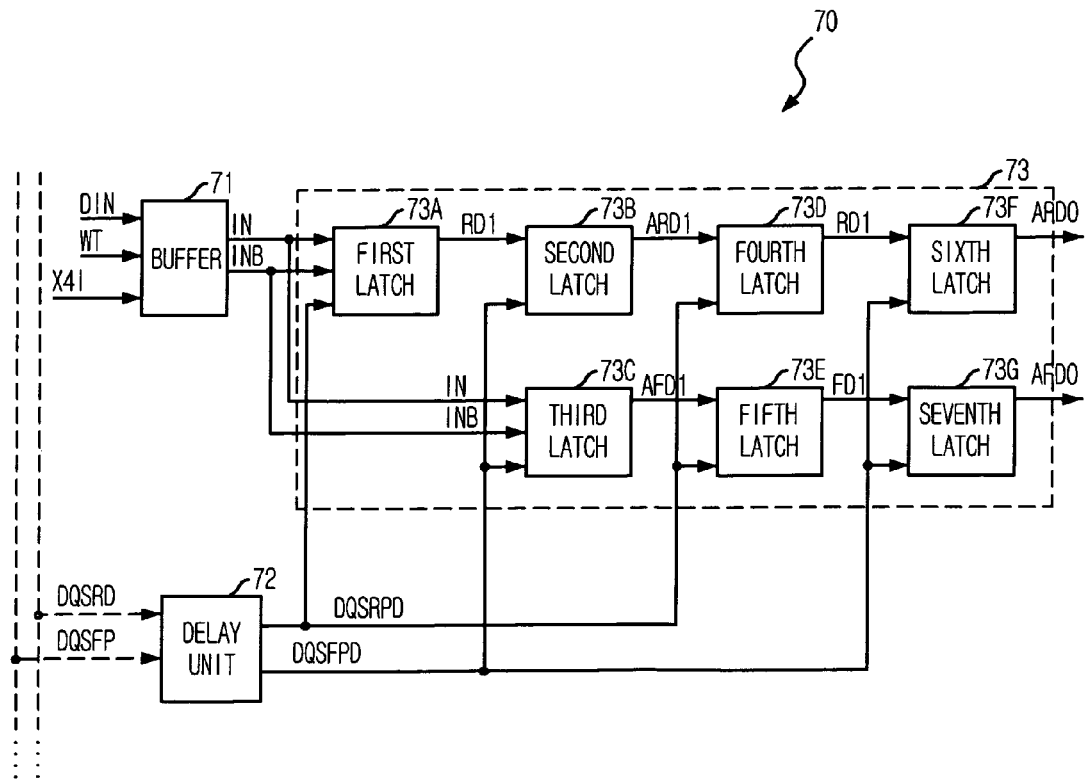
FIG. 3 is a circuit diagram of a fifth data input part of FIG. 1.
Figure 4:
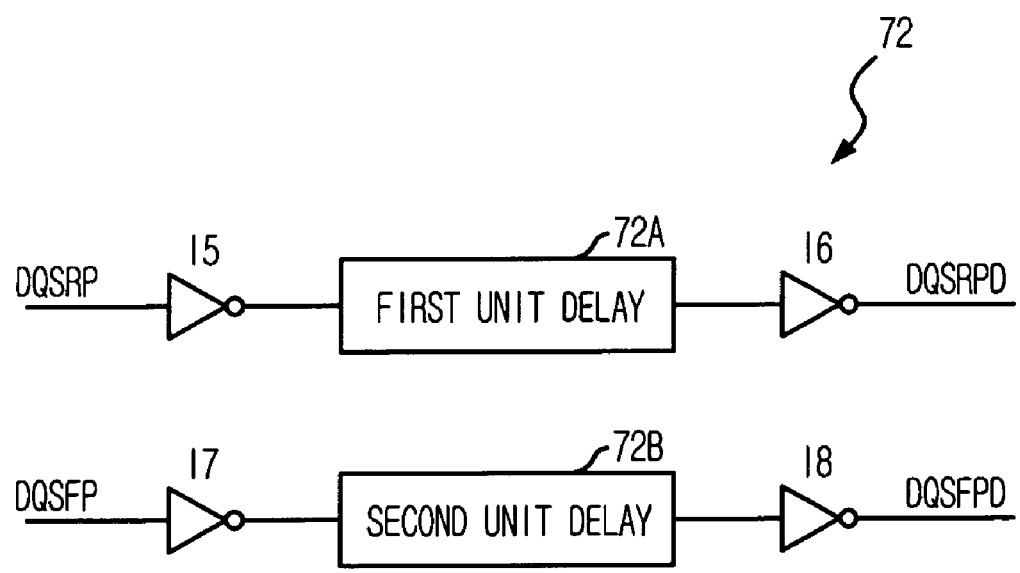
FIG. 4 is a circuit diagram of a delay unit of FIG. 3.
Figure 5:
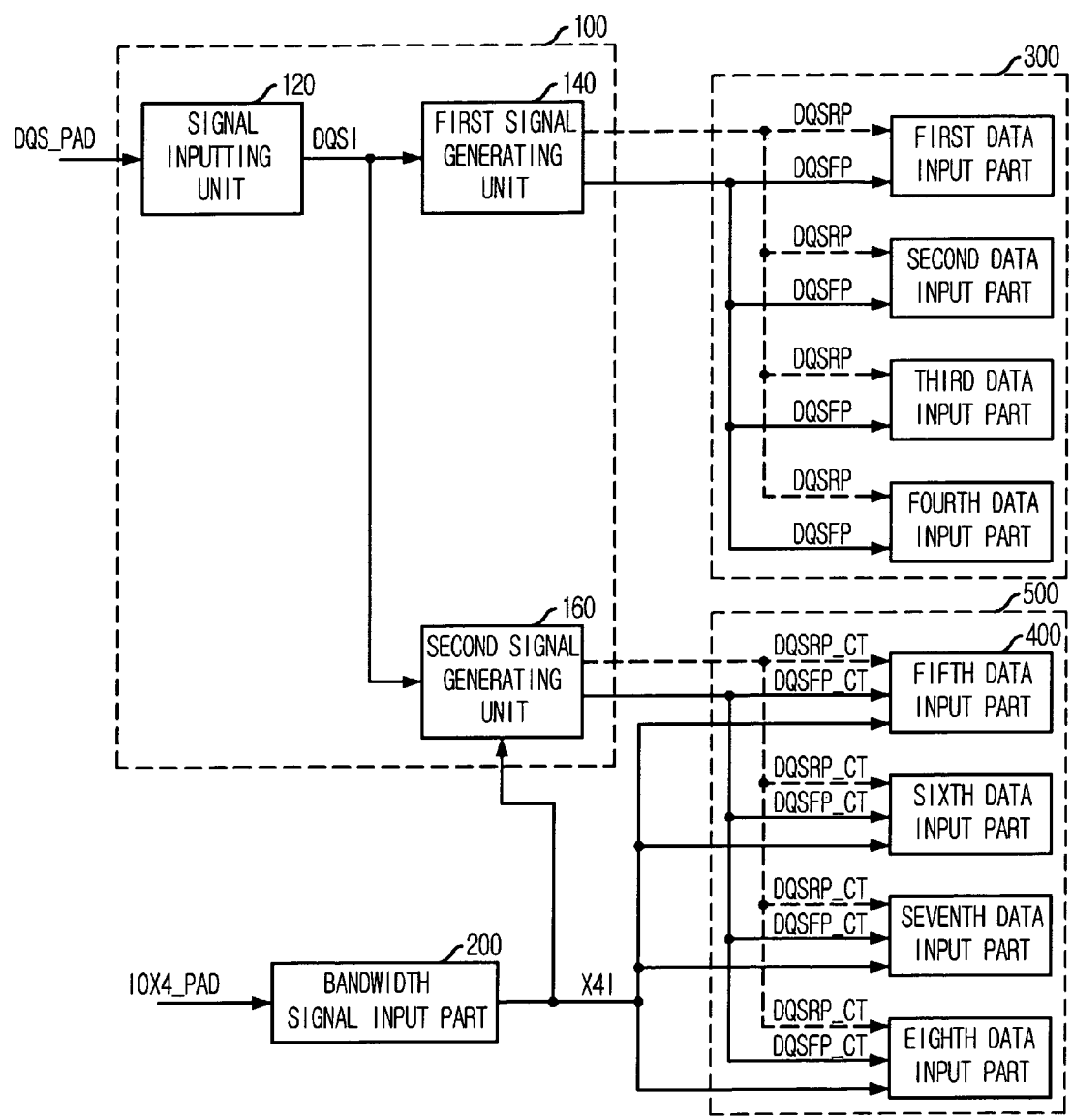
FIG. 5 is a block diagram of a data input device of a semiconductor memory device in accordance with an embodiment of the present invention.

FIG. 5 is a block diagram of a data input device of a semiconductor memory device in accordance with an embodiment of the present invention.

Referring to FIG. 5, the data input device includes a synchronization control part 100, a bandwidth signal input part 200, a plurality of data input parts 300, and a data input part 500. The bandwidth signal input part 200 receives a bandwidth signal IOX4_PAD to output an internal bandwidth signal X4I. The synchronization control part 100 receives a data strobe signal DQS_PAD and the internal bandwidth signal X4I to generate restrict-synchronization signals DQSRP_CT and DQSFP_CT and synchronization signals DQSRP and DQSFP. The plurality of data input parts 300 align data in response to the synchronization signals DQSRP and DQSFP. The data input part 500 aligns data in response to the restrict-synchronization signals DQSRP_CT and DQSFP_CT and the internal bandwidth signal X4I.

The synchronization control part 100 includes a signal inputting unit 120 for receiving the data strobe signal DQS_PAD to output an internal data strobe signal DQSI, a first signal generating unit 140 for generating the first and second synchronization signals DQSRP and DQSFP synchronized with the rising and falling edges of the internal data strobe signal DQSI, and a second signal generating unit 160 for generating the first and second restrict-synchronization signals DQSRP_CT and DQSFP_CT synchronized with the rising and falling edges of the internal data strobe signal DQSI in response to the internal bandwidth signal X4I.

An operation of the data input device will be described below.

The bandwidth signal input part 200 receives the bandwidth signal IOX4_PAD to output the internal bandwidth signal X4I of an internal voltage level.

The synchronization control part 100 generates the synchronization signals DQSRP and DQSFP synchronized with the rising and falling edges of the data strobe signal DQS_PAD. When the internal bandwidth signal X4I is deactivated, the synchronization control part 100 generates the restrict-synchronization signals DQSRP_CT and DQSFP_CT synchronized with the data strobe signal DQS_PAD. On the contrary, when the internal bandwidth signal X4I is activated, the synchronization control part 100 deactivates the restrict-synchronization signals DQSRP_CT and DQSFP_CT regardless of the activation of the data strobe signal DQS_PAD.

Therefore, the plurality of data input parts 300 receiving the synchronization signals DQSRP and DQSFP align the applied data every when the synchronization signals DQSRP and DQSFP are activated. However the plurality of data input parts 500 receiving the restrict-synchronization signals DQSRP_CT and DQSFP_CT may be driven or not driven according to the activation of the internal bandwidth signal X4I.

As described above, regardless of the bandwidth, the data input device generates the synchronization signals DQSRP and DQSFP, which are activated when the data strobe signal DQS_PAD is applied, through the signal inputting unit 120 and the first signal generating unit 140, so that the plurality of data input parts 300 are always activated. Also, the data input device generates the restrict-synchronization signals DQSRP_CT and DQSFP, which are activated or deactivated according to the setting of the bandwidth, through the bandwidth signal generating part 200 and the second signal generating unit 160. In this manner, the driving of the data input part 500 is restricted according to the bandwidth.

That is, the signals for driving the data input device are divided into the restrict-synchronization signals that are activated by the bandwidth signal, and the synchronization signals that are always activated regardless of the bandwidth. Therefore, the driving of the data input device 500 receiving the ineffective data is restricted according to the setting of the bandwidth.

Figure 6:
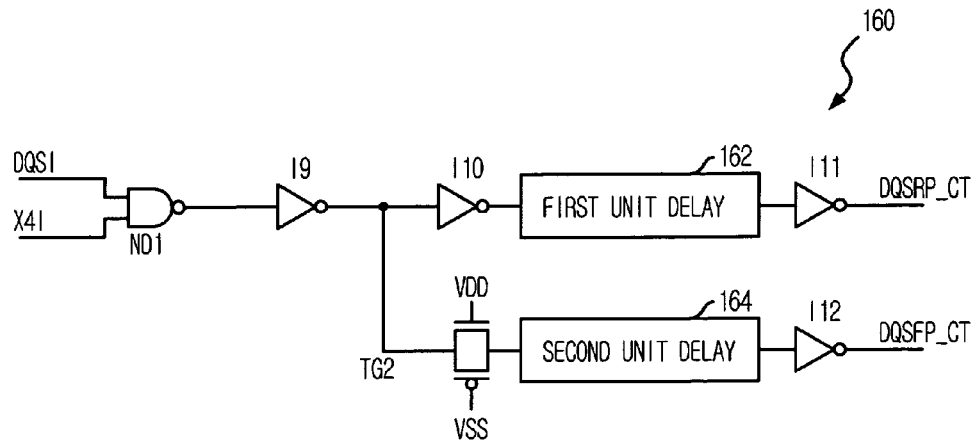
FIG. 6 is a circuit diagram of a second signal generating unit of FIG. 5.

FIG. 6 is a circuit diagram of the second signal generating unit 160 of FIG. 5.

Referring to FIG. 6, the second signal generating unit 160 includes a NAND gate ND1 receiving the internal data strobe signal DQSI and the internal bandwidth signal X4I, a first inverter I9 for inverting an output signal of the NAND gate ND1, a second inverter I10 for inverting an output signal of the first inverter I9, a transfer gate TG2 for transferring the output signal of the first inverter I9, a first unit delay 162 for delaying an output signal of the second inverter I10 for a predetermined time, a second unit delay 164 for delaying an output signal of the transfer gate TG2 for a predetermined time, a third inverter I11 for inverting an output signal of the first unit delay 162 to output the first restrict-synchronization signal DQSRP_CT, and a fourth inverter I12 for inverting an output signal of the second unit delay 164 to output the second restrict-synchronization signal DQSFP_CT.

Upon the operation of the second signal generating unit 160, when the internal bandwidth signal X4I is activated, the second signal generating unit 160 deactivates the first and second restrict-synchronization signals DQSRP_CT and DQSFP_CT. When the internal bandwidth signal X4I is deactivated, the signal generating unit 160 activates the first and second restrict-synchronization signals DQSRP_CT and DQSFP_CT in synchronization with the rising and falling edges of the internal data strobe signal DQSI.

The data input part 500 receiving the first and second restrict-synchronization signals DQSRP_CT and DQSFP_CT will be described below in detail. Since the fifth to eighth data input parts have the same circuit configuration, only the fifth data input part 400 will be described.

Figure 7:
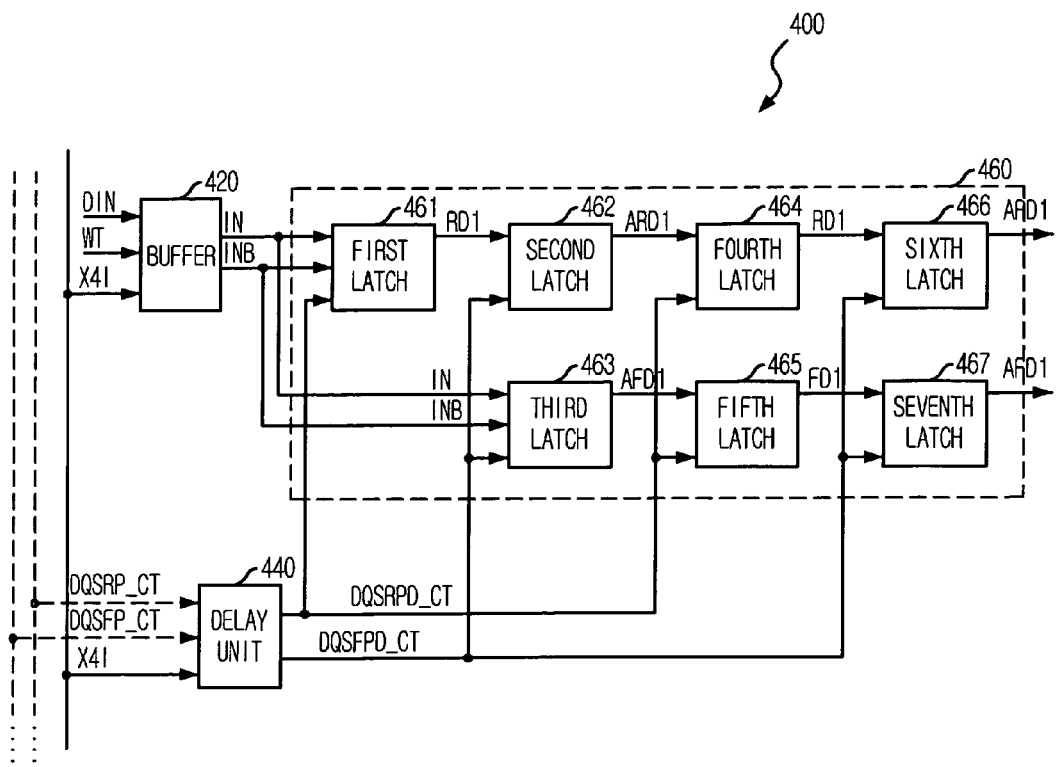
FIG. 7 is a circuit diagram of a fifth data input part of FIG. 5.

FIG. 7 is a circuit diagram of the fifth data input part 400 of FIG. 5.

Referring to FIG. 7, the fifth data input part 400 includes a buffer 420 for receiving the internal data DIN in response to the write information signal WT and the internal bandwidth signal X4I, a delay unit 440 for delaying the first and second restrict-synchronization signals DQSRP_CT and DQSFP_CT in response to the internal bandwidth signal X4I, and a latch unit 460 for storing output signals of the buffer 420, which are inputted in sequence, in synchronization with edges of the first and second delayed restrict-synchronization signals DQSRPD_CT and DQSPD_CT to output 4-bit parallel data ARD1, ARD0, AFD1 and AFD0.

Specifically, the latch unit 460 includes a first latch 461 for storing positive and negative outputs IN and INB of the buffer 420 in response to the first delayed restrict-synchronization signal DQSRPD_CT, a second latch 462 for storing an output data of the first latch 461 in response to the second delayed restrict-synchronization signal DQSFPD_CT and outputting the first parallel data ARD1, a third latch 463 for storing the positive/negative outputs IN and INB of the buffer 420 in response to the second delayed restrict-synchronization signal DQSFPD_CT and outputting the second parallel data AFD1, a fourth latch 464 for storing the first parallel data ARD1 in response to the first delayed restrict-synchronization signal DQSRPD_CT, a fifth latch 465 for storing the second parallel data AFD1 in response to the first delayed restrict-synchronization signal DQSRPD_CT, a sixth latch 466 for storing an output data of the fourth latch 464 in response to the second delayed restrict-synchronization signal DQSFPD_CT and outputting the third parallel data ARD0, and a seventh latch 467 for storing an output data of the fifth latch 465 in response to the second delayed restrict-synchronization signal DQSFPD_CT and outputting the fourth parallel data AFD0.

Figure 8:
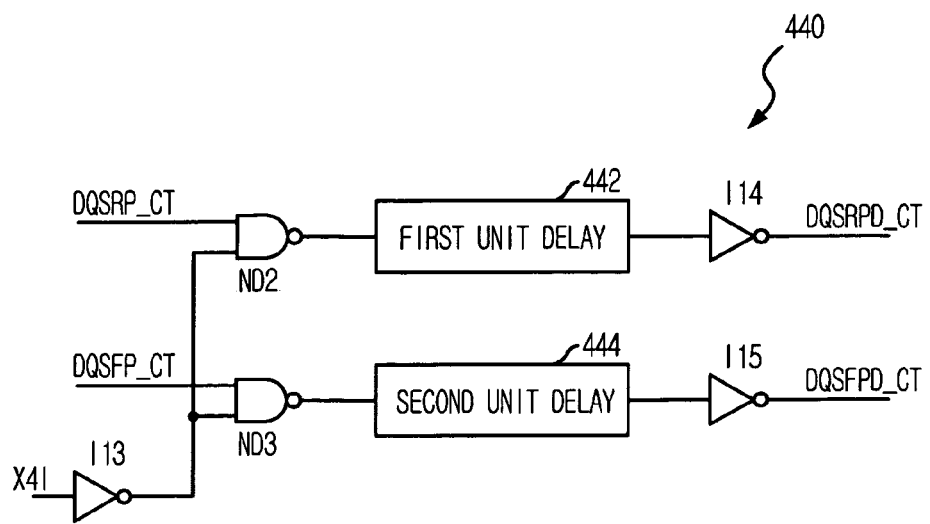
FIG. 8 is a circuit diagram of a delay unit of FIG. 7.

FIG. 8 is a circuit diagram of the delay unit 440 shown in FIG. 7.

Referring to FIG. 8, the delay unit 440 includes a first inverter I13 for inverting the internal bandwidth signal X4I, a first NAND gate ND2 receiving the first restrict-synchronization signal DQSRP_CT and an output signal of the first inverter I13, a second NAND gate ND3 receiving the second restrict-synchronization signal DQSFP_CT and the output signal of the first inverter I13, first and second unit delays 442 and 444 for delaying output signals of the first and second NAND gates ND2 and ND3 for a predetermined time, respectively, a second inverter I14 for inverting an output signal of the first unit delay 442 to output the first delayed restrict-synchronization signal DQSRPD_CT, and a third inverter I15 for inverting an output signal of the second unit delay 444 to output the second delayed restrict-synchronization signal DQSFPD_CT.

Figure 9:
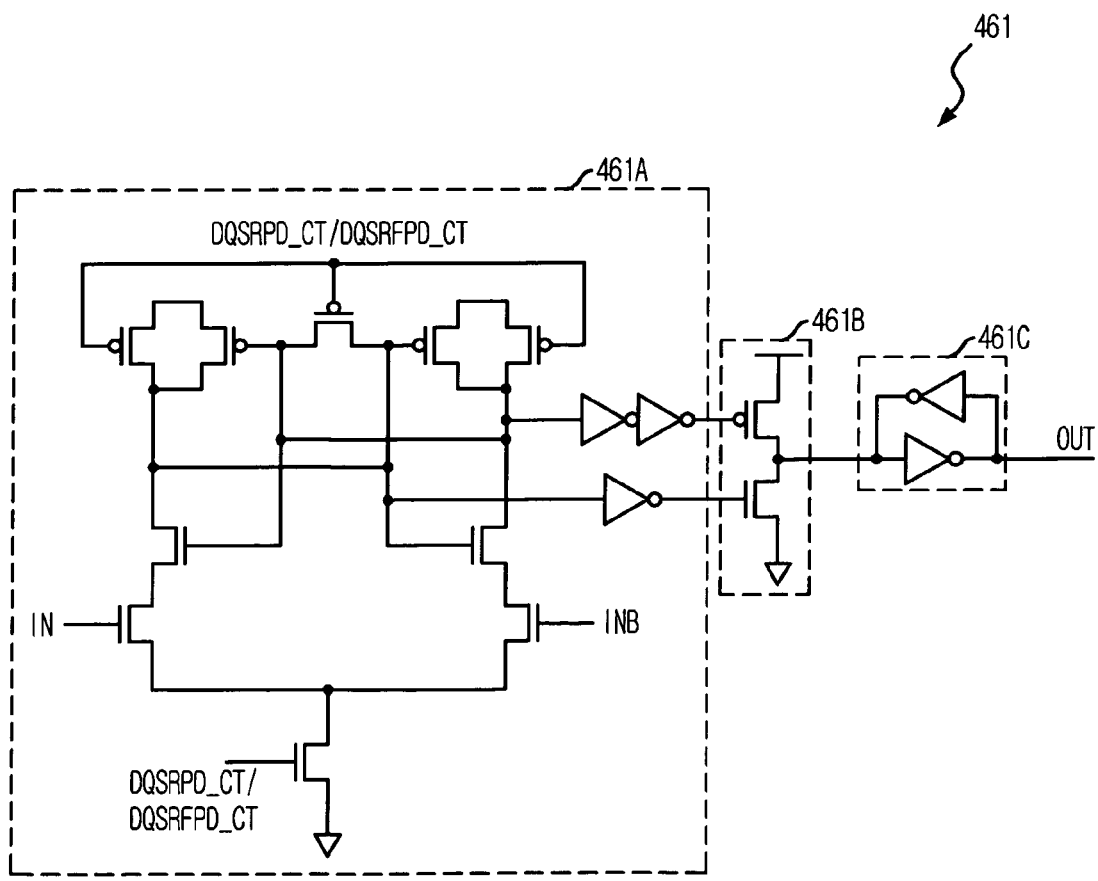
FIG. 9 is a circuit diagram of a first latch of FIG. 7.

FIG. 9 is a circuit diagram of the first latch 461 of FIG. 7. Since the first to seventh latches 461 to 467 have the same circuit configuration, only the first latch 461 will be described.

Referring to FIG. 9, the first latch 461 includes a differential amplifier 461A for receiving the differential positive and negative outputs IN and INB of the buffer 420 in response to the first delayed restrict-synchronization signal DQSRP-D_CT, a driver 461B for driving an output signal of the differential amplifier 461A, and an output unit 461C for latching an output signal of the driver 461B and outputting the latched signal as the output signal of the first latch 461.

An operation of the fifth data input part 400 illustrated in FIGS. 7 to 9 will be described below.

First, when the internal bandwidth signal X4I is deactivated, the buffer 420 receives the internal data DIN and the delay unit 440 delays the first and second restrict-synchronization signals DQSRP_CT and DQSFP_CT for a predetermined time to output the first and second delayed restrict-synchronization signals DQSRPD_CT and DQSFPD_CT.

When the internal bandwidth signal X4I is activated, the buffer 420 does not receive the internal data DIN and the delay unit 440 deactivates the first and second delayed restrict-synchronization signals DQSRPD_CT and DQSFP-D_CT.

Therefore, the first to seventh latches 461 to 467 are not driven by the deactivation of the first and second delayed restrict-synchronization signals DQSRPD_CT and DQSFP-D_CT.

The above-described driving method is equally performed on the fifth to eighth data input parts.

That is, when the bandwidth is set to X4 and thus the effective data are not applied through the data pins DQ4 to DQ7, the data input device deactivates the restrict-synchronization signals DQSRP_CT and DQSFP_CT, so that the latch is turned off. Consequently, it is possible to prevent the driving of the latch, which is caused by the activation of the synchronization signals DQSRP and DQSFP even when the buffer of the conventional input part is turned off, thereby reducing current consumption due to the unnecessary driving of the latch.

Figure 10:
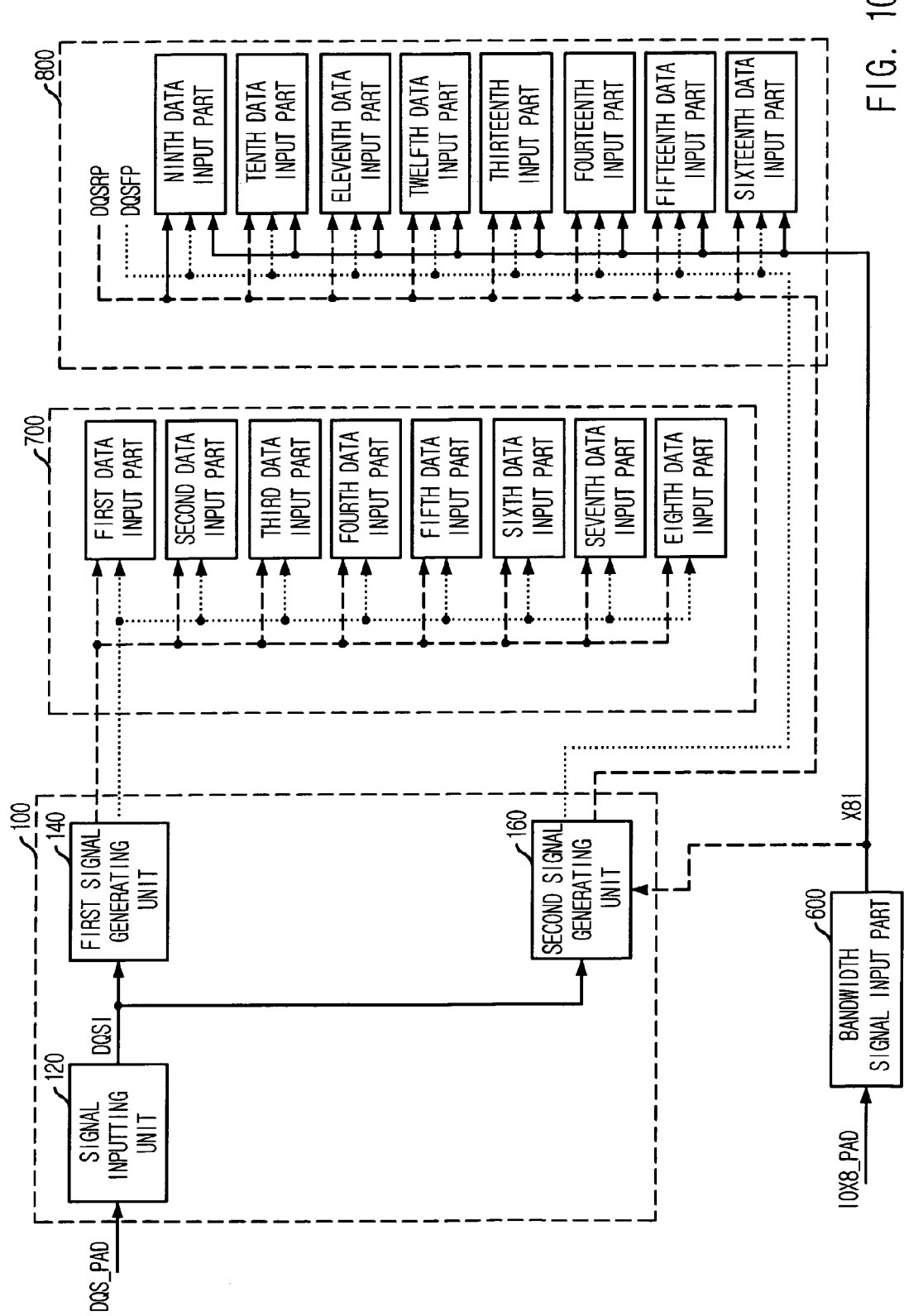
FIG. 10 is a block diagram of a data input device when the semiconductor memory device supports data bandwidth of X8 and X16.

FIG. 10 is a block diagram of a data input device when the semiconductor memory device supports the data bandwidth of X8 and X16 in accordance with a second embodiment of the present invention.

The data input device of FIG. 10 has the same configuration as that of FIG. 5, except the number of the data input parts.

The data input device in accordance with the second embodiment of the present invention includes sixteen data input parts because it has to receive data applied through sixteen data pads. Among them, the first to eighth data input parts 700 receive data in synchronization with the first and second synchronization signals DQSRP and DQSFP that are always activated regardless of the bandwidth signal IOX4_PAD. The ninth to sixteenth data input parts 800 are driven in synchronization with the first and second restrict-synchronization signals DQSRP_CT and DQSFP_CT, which are restricted in activation by the bandwidth signal IOX4_PAD.

In other words, when the bandwidth is set to X16, the bandwidth signal IOX4_PAD is deactivated so that the first and second synchronization signals DQSRP and DQSFP and the first and second restrict-synchronization signals DQSR-P_CT and DQSFP_CT are all activated. Consequently, the first to sixteenth data input parts 700 and 800 are driven. However, when the bandwidth is set to X8, the bandwidth signal IOX4_PAD is activated so that only the first and second synchronization signals DQSRP and DQSFP are activated. Consequently, the first to sixteenth data input parts 800 are not driven.

Therefore, the latch of the data input part receiving the ineffective data according to the bandwidth is not driven because the restrict-synchronization signals DQSRP_CT and DQSFP_CT are not activated, thereby reducing the unnecessary current consumption.

Although eight or sixteen data input parts have been described above, the present invention is not limited to the number of the data bits, only if the driving of the latch of the data input device is restricted by determining the activation of the driving signal according to the setting of the bandwidth.

The present application contains subject matter related to Korean patent application Nos. 2005-26261 & 2005-91575, filed in the Korean Intellectual Property Office on Sep. 29, 2005 & Mar. 22, 2006, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A data input device of a semiconductor memory device, comprising:
    a bandwidth signal input part for receiving a bandwidth signal for setting a data bandwidth to output an internal bandwidth signal;
    a synchronization control part for generating synchronization signals and restrict-synchronization signals in synchronization with a data strobe signal, an activation of the restrict-synchronization signals being restricted through the internal bandwidth signal;
    a first data input part for aligning the data in response to the synchronization signals; and
    a second data input part for aligning the data in response to the restrict-synchronization signal and the internal bandwidth signal.

2. The data input device as recited in claim 1, wherein the synchronization control part includes:
    a signal inputting unit for receiving the data strobe signal to output an internal data strobe signal;
    a first signal generating unit for generating first and second synchronization signals synchronized with rising and falling edges of the internal data strobe signal, respectively; and
    a second signal generating unit for generating first and second restrict-synchronization signals synchronized with the rising and falling edges of the internal data strobe signal in response to the internal bandwidth signal.

3. The data input device as recited in claim 2, wherein the second signal generating unit deactivates the first and second restrict-synchronization signals when the internal bandwidth signal is activated, and generates the first and second restrict-synchronization signals synchronized with the rising and falling edges of the internal data strobe signal when the internal bandwidth signal is inactivated.

4. The data input device as recited in claim 3, wherein the second signal generating unit includes:
    a first NAND gate receiving the internal data strobe signal and the internal bandwidth signal;

a first inverter for inverting an output signal of the first NAND gate;

a second inverter for inverting an output signal of the first inverter;

a first transfer gate for transferring the output signal of the first inverter;

a first unit delay for delaying an output signal of the second inverter for a predetermined time;

a second unit delay for delaying an output signal of the first transfer gate for a predetermined time;

a third inverter for inverting an output signal of the first unit delay to output the first restrict-synchronization signal; and a fourth inverter for inverting an output signal of the second unit delay to output the second restrict-synchronization signal.

5. The data input device as recited in claim 3, wherein the first data input part includes a plurality of data inputting units for aligning data in response to the first and second synchronization signals, and the second data input part includes a plurality of data inputting units for aligning data in response to the internal bandwidth signal and the first and second restrict-synchronization signals.

6. The data input device as recited in claim 5, wherein the data inputting unit of the second data input part includes:

a buffer for receiving internal data in response to a write information signal and the internal bandwidth signal;

a delay unit for delaying the first and second restrict-synchronization signals in response to the internal bandwidth signal to output delayed restrict-synchronization signals; and a latch unit for storing sequential positive and negative outputs of the buffer in response to the first and second delayed restrict-synchronization signals and outputting parallel data.

7. The data input device as recited in claim 6, wherein the delay unit delays the first and second restrict-synchronization signals for a predetermined time and outputs the first and second delayed restrict-synchronization signals when the internal bandwidth signal is deactivated, and deactivates the first and second delayed restrict-synchronization signals when the internal bandwidth signal is activated.

8. The data input device as recited in claim 7, wherein the delay unit includes:

a fifth inverter for inverting the internal bandwidth signal;

a second NAND gate receiving the first restrict-synchronization signal and an output signal of the fifth inverter;

a third NAND gate receiving the second restrict-synchronization signal and the output signal of the fifth inverter;

third and fourth unit delays for delaying output signals of the second and third NAND gates for a predetermined time, respectively;

a sixth inverter for inverting an output signal of the third unit delay to output the first delayed restrict-synchronization signal; and a seventh inverter for inverting an output signal of the fourth unit delay to output the second delayed restrict-synchronization signal.

9. The data input device as recited in claim 6, wherein the latch unit includes:

a first latch for storing the positive and negative outputs of the buffer in response to the first delayed restrict-synchronization signal;

a second latch for storing an output data of the first latch in response to the second delayed restrict-synchronization signal to output first parallel data;

a third latch for storing the positive and negative outputs of the buffer in response to the second delayed restrict-synchronization signal to output second parallel data;

a fourth latch for storing the first parallel data in response to the first delayed restrict-synchronization signal;

a fifth latch for storing the second parallel data in response to the first delayed restrict-synchronization signal;

a sixth latch for storing an output data of the fourth latch in response to the second delayed restrict-synchronization signal to output third parallel data; and a seventh latch for storing an output data of the fifth latch in response to the second delayed restrict-synchronization signal to output fourth parallel data.

10. The data input device as recited in claim 9, wherein each of the latches includes:

a differential amplifier for receiving differential input signals in response to the first or second delayed restrict-synchronization signal;

a driver for driving an output signal of the differential amplifier; and an output unit for latching an output signal of the driver to output the latched signal as the output signal of the latch.

11. A data input device for a semiconductor memory device, comprising:

a first synchronization control part for generating synchronization signals synchronized with edges of a data strobe signal;

a second synchronization control part for generating restrict-synchronization signals synchronized with the edges of the data strobe signal in response to a bandwidth signal for setting a data bandwidth;

a first data input part for aligning data in response to the synchronization signals; and a second data input part for aligning the data in response to the restrict-synchronization signal and an internal bandwidth signal.

12. The data input device as recited in claim 11, wherein the second synchronization control part deactivates the first and second restrict-synchronization signals when the internal bandwidth signal is activated, and generates the first and second restrict-synchronization signals synchronized with rising and falling edges of the internal data strobe signal when the internal bandwidth signal is inactivated.

13. The data input device as recited in claim 12, wherein the second synchronization control part includes:

a first signal inputting unit for receiving the bandwidth signal and outputs the internal bandwidth signal;

a second signal inputting unit for receiving the data strobe signal to output an internal data strobe signal; and a signal generating unit for outputting the first and second restrict-synchronization signals synchronized with the rising and falling edges of the internal data strobe signal when the internal bandwidth signal is deactivated.

14. The data input device as recited in claim 13, wherein the signal generating part includes:

a NAND gate receiving the internal data strobe signal and the internal bandwidth signal;

a first inverter for inverting an output signal of the NAND gate;

a second inverter for inverting an output signal of the first inverter;

a first transfer gate for transferring the output signal of the first inverter;

a first unit delay for delaying an output signal of the second inverter for a predetermined time;

a second unit delay for delaying an output signal of the first transfer gate for a predetermined time;

a third inverter for inverting an output signal of the first unit delay to output the first restrict-synchronization signal; and a fourth inverter for inverting an output signal of the second unit delay to output the second restrict-synchronization signal.

15. The data input device as recited in claim 12, wherein the first synchronization control part includes:

a signal inputting unit for receiving the data strobe signal and outputting the internal data strobe signal; and a signal generating unit for generating the first and second synchronization signals synchronized with the rising and falling edges of the data strobe signal.

16. The data input device as recited in claim 12, wherein the first data input part includes a plurality of data inputting units for aligning data in synchronization with the first and second synchronization signals, and the second data input part includes a plurality of data inputting units for aligning data in response to the internal bandwidth signal and the first and second restrict-synchronization signals.

17. The data input device as recited in claim 16, wherein the data inputting unit of the second data input part includes:

a buffer for receiving internal data in synchronization with a write information signal and the internal bandwidth signal;

a delay unit for delaying the first and second restrict-synchronization signals in response to the internal bandwidth signal to output first and second delayed restrict-synchronization signals; and a latch unit for string sequential positive and negative outputs of the buffer in response to the first and second delayed restrict-synchronization signals to output parallel data.

18. The data input device as recited in claim 17, wherein the delay unit delays the first and second restrict-synchronization signals for a predetermined time to output the first and second delayed restrict-synchronization signals when the internal bandwidth signal is deactivated, and deactivates the first and second delayed restrict-synchronization signals when the internal bandwidth signal is activated.

19. The data input device as recited in claim 18, wherein the delay units include:

a first inverter for inverting the internal bandwidth signal;

a first NAND gate receiving the first restrict-synchronization signal and an output signal of the first inverter;

a second NAND gate receiving the second restrict-synchronization signal and the output signal of the first inverter;

first and second unit delays for delaying output signals of the first and second NAND gates for a predetermined time, respectively;

a second inverter for inverting an output signal of the first unit delay to output the first delayed restrict-synchronization signal; and a third inverter for inverting an output signal of the second unit delay to output the second delayed restrict-synchronization signal.

* * * * *